United States Patent
Ding et al.

(10) Patent No.: US 10,476,367 B2
(45) Date of Patent: Nov. 12, 2019

(54) VOLTAGE AND CURRENT TRIGGERED SWITCH, AND STEP-DOWN DC-DC CONVERTERS CONTAINING SUCH A SWITCH

(71) Applicant: NATIONAL RESEARCH COUNCIL OF CANADA, Ottawa (CA)

(72) Inventors: Heping Ding, Ottawa (CA); George Xiao, Ottawa (CA); Ryan Griffin, Ottawa (CA); Ye Tao, Ottawa (CA)

(73) Assignee: NATIONAL RESEARCH COUNCIL OF CANADA, Ottawa (CA)

( * ) Notice: Subject to any disclaimer, the term of this patent is extended or adjusted under 35 U.S.C. 154(b) by 0 days.

(21) Appl. No.: 15/933,970

(22) Filed: Mar. 23, 2018

(65) Prior Publication Data
US 2019/0296631 A1    Sep. 26, 2019

(51) Int. Cl.
*H02M 1/08* (2006.01)
*H02M 3/156* (2006.01)

(52) U.S. Cl.
CPC ............ *H02M 1/08* (2013.01); *H02M 3/156* (2013.01)

(58) Field of Classification Search
CPC .. H02M 1/08; H02M 1/32; H02M 3/156–158; H02M 3/33507; H02M 3/33523; H02M 3/33561; H02M 3/33569; H02M 3/33576; H02M 2001/0032; Y02B 70/1433; Y02B 70/1441; Y02B 70/1475
USPC .......................................... 363/21.01–21.18
See application file for complete search history.

(56) References Cited

U.S. PATENT DOCUMENTS

| | | | | |
|---|---|---|---|---|
| 3,341,763 A | * | 9/1967 | Noddin | H02J 7/022 320/137 |
| 3,376,500 A | * | 4/1968 | Scaggs | G01R 33/24 324/301 |
| 4,001,663 A | * | 1/1977 | Bray | H02M 3/33523 323/282 |
| 4,878,010 A | * | 10/1989 | Weber | H02M 5/257 323/300 |
| 5,343,053 A | | 8/1994 | Avery | |
| 5,589,753 A | * | 12/1996 | Kadah | H02P 1/42 318/785 |

(Continued)

FOREIGN PATENT DOCUMENTS

| | | |
|---|---|---|
| EP | 1855365 A1 | 11/2007 |
| WO | 2017036938 A1 | 3/2017 |

OTHER PUBLICATIONS

Ottman, et al., "Optimized Piezoelectric Energy Harvesting Circuit Using Step-Down Converter in Discontinuous Conduction Mode", IEEE Transactions on Power Electronics, vol. 18, No. 2, Mar. 2003.

(Continued)

*Primary Examiner* — Yemane Mehari

(57) ABSTRACT

A voltage and current triggered switch that turns on when a voltage across the switch reaches a turn-on voltage and that turns off when a current through the switch drops below a holding current. The switch features a Zener diode having a breakdown voltage. The Zener diode is connected to set the turn-on voltage of the switch to be the breakdown voltage of the Zener diode. Also provided is a step-down DC-DC converter comprising such a switch. Also provided is a system that has a tribo-electricity source or a piezo-electricity source, the provided step-down DC-DC converter and a load connected to an output of the stepdown DC-DC converter.

22 Claims, 6 Drawing Sheets

(56) References Cited

U.S. PATENT DOCUMENTS

| | | | |
|---|---|---|---|
| 5,627,708 A * | 5/1997 | Lee | H02M 1/425 361/18 |
| 6,411,148 B1 | 6/2002 | Miyashita et al. | |
| 8,884,537 B2 * | 11/2014 | Liao | G05F 1/10 315/179 |
| 9,006,999 B2 * | 4/2015 | Harel | H05B 33/0815 315/209 R |
| 2008/0192394 A1 | 8/2008 | Harris | |
| 2014/0055174 A1 | 2/2014 | Knoedgen | |
| 2016/0365795 A1 * | 12/2016 | Madsen | H02M 3/158 |

OTHER PUBLICATIONS

Niu et al., "A universal self-charging system driven by random biomechanical energy for sustainable operation of mobile electronics", Nature Communications | 6:8975 | DOI: 10.1038/ncomms9975 | www.nature.com/naturecommunications, Dec. 11, 2015.

Kuang et al., "Energy harvesting during human walking to power a wireless sensor node", Sensors and Actuators A: Physical, Sensors and Actuators A 254 (2017) 69-7, Dec. 10, 2016.

Miller et al., "Maximum Performance of Piezoelectric Energy Harvesters When Coupled to Interface Circuits", IEEE Sensors Journal, vol. 16, No. 12, Jun. 15, 2016.

Caliò, et al., "Piezoelectric Energy Harvesting Solutions", Sensors 2014, 14, 4755-4790; doi:10.3390/s140304755, Mar. 10, 2014.

Guan et al., On the efficiencies of piezoelectric energy harvesting circuits towards storage device voltages, Smart Materials and Structures Laboratory, Department of Mechanical and Automation Engineering, The Chinese University of Hong Kong, Shatin, N.T., Hong Kong, People's Republic of China Mar. 2, 2006.

Lefeuvre, et al. "Analysis of piezoelectric energy harvesting system with tunable SECE interface", Centre for Nanoscience and Nanotechnology, Univ. Paris Sud—CNRS, Université Paris-Saclay, France, Feb. 21, 2017.

* cited by examiner

VOLTAGE AND CURRENT TRIGGERED SWITCH, AND STEP-DOWN DC-DC CONVERTERS CONTAINING SUCH A SWITCH

FIELD

The application relates to voltage and current triggered switches, and to step-down DC-DC converters featuring such switches.

BACKGROUND

Many sources of energy that can be harvested are in the form of electricity or can be readily converted to it. However in most practical situations, these electricity sources are weak, with too high or too low a voltage, and/or with certain other issues such as low duty cycle. Consequently, they are rarely directly useful to any electronic devices, which normally require a relatively steady supply of a direct current (DC) voltage of a few volts.

There is a need for simple and practical ways to efficiently convert the electricity generated by low-power energy harvesting systems of intermittent high voltage and low current, such as tribo- or piezo-electricity generators, into a usable form for low-power electronic devices such as those in the Internet of Things (IoT) applications.

In general, to turn the electricity generated by low-power energy harvesting systems of high voltage and low current, such as tribo-/piezo-electricity, into a usable form, a step-down DC-DC converter is used to turn a high voltage and low current DC into another DC with a lower voltage and a larger current.

There are many step-down DC-DC converters available on the market. Some of them use capacitors and inductors for energy transfer and some are inductor-free such as those using the charge pump and switched-capacitor principles.

In many available low-power energy harvesting systems of intermittent high voltage and low current such as those for tribo-/piezo-energy harvesting, the harvested electricity is alternating current (AC) and can have an open-circuit peak voltage of 200-300 volts or beyond and a corresponding short-circuit current of a few tens of micro-amps. Nevertheless, the average current is substantially lower given the extremely low duty cycle of the peaks. Since the tribo-/piezo-electricity in most practical cases is weak, fluctuating a lot and even intermittent, the existing step-down DC-DC converters have the following limitations if used in this energy harvesting application:

their input needs to be a steady DC in a relatively small range (a few volts to a few tens of volts) in order for them to work properly, while the voltage from tribo-/piezo-energy harvesting devices most likely fluctuates a lot and even disappears;

their input voltage should be no more than a few tens of volts, whereas the voltage in the tribo-/piezo-electricity realm is easily 200-300 volts or beyond; and they themselves consume significant amount of power (a few µA to a few tens of µA), known as the overhead. Consequently, i. most tribo-/piezo-energy harvesting devices cannot afford to provide this overhead power; and ii. even if in quite unlikely cases these devices can provide the overhead power, the DC-DC converter's efficiency will be too low to be practical when operating under such low-power scenarios.

Some existing step-down DC-DC converters employ a MOSFET as the switch. While this seems to be a viable option from a first glance, there are practicality issues associated with the use of a MOSFET as the switch. These issues are:

Usually, a high voltage compatible MOSFET when off has a relatively large leakage current, about a fraction of 1 µA. Although this may be acceptably small in most other applications, it may not be ignored in the context of tribo-/piezo-energy harvesting, where the average current an energy harvesting device is able to produce is in the same order if not less. As a result, at least a significant portion of the harvested energy will be wasted due to the MOSFET leakage.

A MOSFET needs to be driven by a control module, consisting of maybe a microcontroller system and a driver capable of producing a few volts and a significant current—to overcome the gate-source turn-on voltage and the gate capacitance, respectively. Such a need complicates the system design and implementation and may add additional constraints if not done properly.

The need for a control module imposes another potential issue: the system may not be able to self-start when there is no auxiliary power available, e.g., a battery or the like.

SUMMARY

A voltage and current triggered switch that turns on when a voltage across the switch reaches a turn-on voltage and that turns off when a current through the switch drops below a holding current. The switch features a Zener diode having a breakdown voltage. The Zener diode is connected to set the turn-on voltage of the switch to be the breakdown voltage of the Zener diode. Also provided is a step-down DC-DC converter comprising such a switch. Also provided is a system that has a tribo-electricity source or a piezo-electricity source, the provided step-down DC-DC converter and a load connected to an output of the stepdown DC-DC converter.

Advantageously, the ON state transition of the voltage and current triggered switch is triggered solely by the voltage across the voltage and current triggered switch (when switch is OFF), and the OFF transition is triggered solely by the current through the voltage and current triggered switch (when switch is ON). The voltage and current triggered switch is self-contained or autonomous, needing no explicit control module at all, let alone any auxiliary power supply. This makes the implementation really simple and avoids the overhead of a control module.

According to one aspect of the present invention, there is provided a voltage and current triggered switch that turns on when a voltage across the switch reaches a turn-on voltage and that turns off when a current through the switch drops below a holding current, the switch comprising: a Zener diode having a breakdown voltage, the Zener diode connected to set the turn-on voltage of the switch to be the breakdown voltage of the Zener diode.

Optionally, the switch further comprises: a positive terminal and a negative terminal; a PNP bipolar junction transistor (BJT); an NPN BJT; a first resistor; a second resistor; wherein the positive terminal is connected to an emitter of the PNP bipolar junction transistor, and to a first terminal of the first resistor, and a second terminal of the first resistor is connected to a base of the PNP BJT; the negative terminal is connected to an emitter of the NPN BJT and to a first terminal of a second resistor, and a second terminal of the second resistor is connected to a base of the NPN BJT; a collector of the PNP BJT is connected to the base of the NPN BJT, and a collector of the NPN BJT is connected to the base of the PNP BJT.

Optionally, the Zener diode is connected between the collector of the PNP BJT and the base of the PNP BJT, and between the base of the NPN BJT and the collector of the NPN BJT.

Optionally, the Zener diode is connected between the collector of the PNP BJT and the positive terminal.

Optionally, the Zener diode is connected between the collector of the NPN BJT and the negative terminal.

Optionally, the switch further comprises at least one control terminal for over-riding otherwise autonomous operation of the switch.

Optionally, the at least one control terminal comprises one terminal causing an ON and/or OFF transition in the switch.

Optionally, the at least one control terminal comprises a first terminal for causing an ON transition in the switch and a second terminal for causing an OFF transition in the switch.

Optionally, the switch comprises: a positive terminal and a negative terminal; a PMOS transistor; an NMOS transistor; a first resistor; a second resistor; wherein the positive terminal is connected to a source of the PMOS transistor, and to a first terminal of the first resistor, and a second terminal of the first resistor is connected to a gate of the PMOS transistor; the negative terminal is connected to a source of the NMOS transistor and to a first terminal of a second resistor, and a second terminal of the second resistor is connected to a gate of the NMOS transistor; a drain of the PMOS transistor is connected to the gate of the NMOS transistor, and a drain of the NMOS transistor is connected to the gate of the PMOS transistor.

According to another aspect of the present invention, there is provided a step-down DC-DC converter comprising the switch as described above.

Optionally, one terminal of the switch is connected to ground.

Optionally, the stepdown DC-DC converter comprises: a rectifier for rectifying a voltage received at an input to the step-down DC-DC converter; a first capacitor connected to be charged by the rectified voltage while the switch is open; an inductor connected to receive a discharge current from the first capacitor while the switch; a second capacitor connected to be charged by current from the inductor while the switch is again open.

Optionally, the switch is connected between a terminal of the first capacitor and a terminal of the inductor Optionally, the stepdown DC-DC converter further comprises: a Schottky diode connected between an output of the switch and ground to provide a low loss fly-back path during charging of the second capacitor.

Optionally, a terminal of the switch is connected between a terminal of the rectifier and a first terminal of the first capacitor.

Optionally, the stepdown DC-DC converter further comprises a Schottky diode connected between a second terminal of the first capacitor and ground to provide a low loss fly-back path during charging of the second capacitor.

According to another aspect of the present invention, there is provided a system comprising: a tribo-electricity source; a stepdown DC-DC converter as described herein connected to receive an output of the tribo-electricity source; a load connected to an output of the stepdown DC-DC converter.

According to another aspect of the present invention, there is provided a system comprising: a piezo-electricity source; a stepdown DC-DC converter as described herein connected to receive an output of the piezo-electricity source; a load connected to an output of the stepdown DC-DC converter.

According to another aspect of the present invention, there is provided a method comprising rectifying AC electricity from a tribo-/piezo-energy harvesting device; storing the rectified electricity in a first capacitor; once the voltage across the first capacitor has built up to a turn-on voltage set by the breakdown voltage of a Zener diode, closing a voltage and current (V&I)-triggered switch with turn-on voltage threshold set by Zener diode breakdown voltage (VITSZ) to transfer the energy stored in the first capacitor to an inductor; opening the VITSZ, triggered by a current dropping below a threshold current; transferring energy from current in the inductor to a voltage across a second capacitor; and a load consuming the energy stored in the second capacitor.

Optionally, the method further comprises: using at least one control terminal for over-riding otherwise autonomous operation of the method.

Optionally, using at least one control terminal comprises using one terminal causing an ON and/or OFF transition in the switch.

Optionally, using at least one control terminal comprises using a first terminal for causing an ON transition in the VITSZ and a second terminal for causing an OFF transition in the VITSZ.

BRIEF DESCRIPTION OF THE DRAWINGS

Embodiments of the disclosure will now be described with reference to the attached drawings in which.

DETAILED DESCRIPTION

Figure 1:
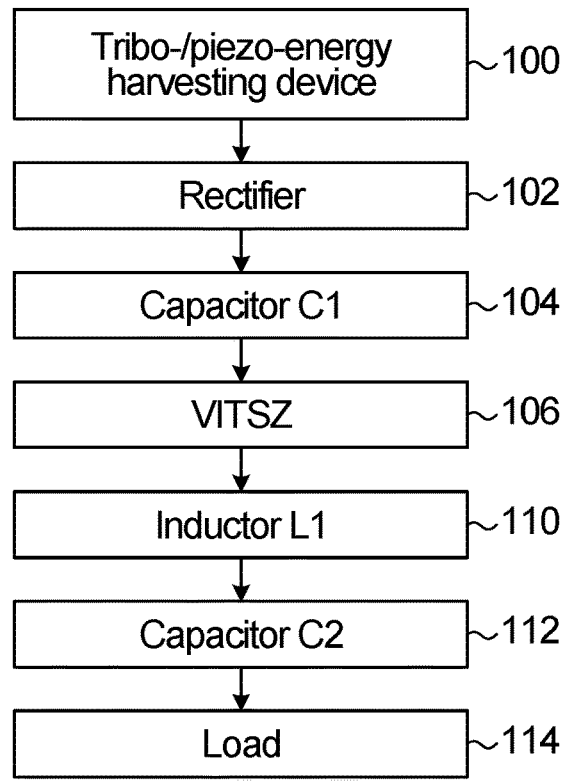
FIG. 1 depicts a block diagram of a DC-DC converter.

FIG. 1 is a functional block diagram of a DC-DC converter provided by an embodiment of the invention. Shown is a tribo-/piezo-electric energy harvesting device 100, a rectifier 102 (in the illustrated example composed of four diodes D1, D2, D3 and D4), a capacitor 104 having capacitance C1, a V&I triggered switch with turn-on voltage threshold set by Zener diode breakdown voltage 106, hereinafter such switch simply referred to as VITSZ for brevity, an inductor 110 having inductance L1, a capacitor 112 having capacitance C2 and a load 114, connected together in sequence. Note that the load 114 is not necessarily a resistor; the load can be a resistor, a Zener diode, a battery, a super-capacitor, a combination of them, or any form of electronic load.

Options for the VITSZ 106, also a standalone embodiment of the invention, are described in detail below.

The operation of the DC-DC converter is described in the following steps:

1. AC electricity from the tribo-/piezo-energy harvesting device 100 is rectified by rectifier 102 into DC and then stored in capacitor 104. The capacitance C1 of capacitor 104 may be relatively small, at least relative to capacitance C2 of capacitor 112, so that the voltage can build up quickly.
2. Once the voltage across capacitor 104 has built up to the turn-on voltage of the VITSZ, set by the breakdown voltage of a Zener diode, indicating that a certain amount of energy has been collected and is ready for conversion, the VITSZ 106 closes to transfer the energy stored in capacitor 104 to the inductor 110. The step of turning the form of the energy from voltage across the capacitor 104 into the current in the inductor 110, is referred to herein as the first energy transfer phase.
3. Once the first energy transfer phase has completed, indicated by the fact that there is little voltage across the capacitor 104 left, the VITSZ 106 opens, triggered by a current dropping below a threshold current referred to as a holding current. This readies capacitor 104 to accept harvested energy again.
4. Step 3 above also initiates a second energy transfer phase in which the form of energy is turned from current in inductor 110 to a voltage across capacitor 112. The capacitance C2 of capacitor 112 is relatively large, in some embodiments much larger, compared to the capacitance C1.
5. The above procedure is repeated when the voltage across C1 reaches the threshold mentioned in Step 2 again.
6. The power stored in capacitor 112 is consumed by load 114.

The VITSZ has the following features:

1. The VITSZ is unidirectional in the sense that the voltage across it will only be in one direction or zero;
2. The VITSZ is normally in the OFF (open) state. When the voltage across the VITSZ starts with zero and stays below the turn-on voltage (set by the breakdown voltage of a Zener diode), the VITSZ stays in the OFF state.
3. Once the voltage across the VITSZ reaches the turn-on threshold, it goes to the ON (closed) state with a minimal voltage drop. The OFF to ON transition is quick so as to minimize the transitional energy loss; and
4. The VITSZ then stays in the ON state until the current through it drops below the holding current, in which case the switch returns to the OFF state quickly.

A schematic diagram of a VITSZ provided by an embodiment of the invention, which can for example be used in the step-down DC-DC converter of FIG. 1, will now be described with reference to FIG. 2. The VITSZ has positive terminal 200 and negative terminal 202. Positive terminal 200 is connected to the emitter of a PNP bipolar junction transistor (BJT) 204, and to a first terminal of a resistor 210. The second terminal of the resistor 210 is connected to the base of the BJT 204. A Zener diode 208 is connected between the collector of BJT 204 and the second terminal of the resistor 210. More specifically, the anode of the Zener diode 208 is connected to the collector of BJT 204, and the cathode of the Zener diode 208 is connected to the second terminal of the resistor 210. The negative terminal 202 is connected to the emitter of an NPN BJT 206 and to a first terminal of a resistor 212. The second terminal of the resistor 212 is connected to the base of the BJT 206. The collector of the PNP BJT 204 is connected to the base of the NPN BJT 206, and the collector of the NPN BJT 206 is connected to the base of the PNP BJT 204.

The Zener diode 208 is connected between the collector of BJT 206 and the second terminal of the resistor 212.

In a specific example, the PNP BJT 204 has part number ZXTP08400BFF, the NPN BJT 206 has part number ZXTN08400BFF, and the Zener diode has part number 1N-4135-1. However, it should be clearly understood that these are simply example part numbers. The BJTs 204,206 should have a small leakage current. What constitutes "small" in this context is dictated by the acceptable amount of loss in the BJTs relative to the current produced by the energy harvesting device. Also, as described in detail below, the breakdown voltage of the Zener diode 208 sets the turn-on voltage of the VITSZ. In the embodiment shown in FIG. 2 the resistors 210,212 have a resistance of 2 MΩ, however in practice resistors having other resistance values may be used.

In operation, the voltage across terminals 200,202 starts from zero and stays below the breakdown voltage of the Zener diode 208, the two transistors 204,206 are off. As a result, the VITSZ is OFF and the leakage current through the VITSZ consists of the $I_{CBO}$'s (Collector-base leakage current while emitter is open) of the two transistors 204,206 and the leakage of the Zener diode 208. For the components shown in FIG. 2, this sum can be less than 10-20 nA. Notably, this leakage current is much smaller than that of a MOSFET or a conventional silicon controlled rectifier (SCR). This small leakage mostly goes through the two resistors 210,212 and the resultant voltage drop across them is not big enough to trigger the transistors 204,206. When the voltage across the switch terminals 200,202 grows close to the breakdown voltage of the Zener diode 208, the Zener diode eventually produces a leakage current large enough to trigger a strong positive feedback between the two transistors 204,206. This mechanism quickly turns both transistors 204,206 on and saturates them. Now, the VITSZ is in the ON state and has a voltage drop of about 1 V. The Zener diode 208 is now off and has no effect anymore, and the two transistors 204,206 are locked in the on state as long as there is sufficient current through them. When the current drops below the holding current, the two transistors 204,206 will transition out of saturation and into the linear region and, again through a positive feedback, quickly turn themselves off. This turns the VITSZ OFF and readies the VITSZ for the next operating cycle.

The feedback between the transistors 204,206 can be explained as follows. Once the voltage drop approaches the breakdown voltage of the Zener diode 208, a large breakdown current is produced. This large current goes through the two resistors 210,212 and causes the voltage across the two resistors to be large enough to turn on the two transistors 204,206. This creates a large current in the collector of at least one of the two transistors. If the left transistor 204 turns on first, the collector current of transistor 204 will pass through the base and emitter of the second transistor 206 turning that transistor on. In turn this will result in a large current in the collector of the second transistor 206 which will feed back to the first transistor 204. The result is that the transistors 204,206 are locked in the ON state, until the current drops to below a very small threshold.

While the VITSZ is off, the input voltage charges capacitor 104. Once the VITSZ is on, the capacitor 104 discharges to the inductor 110. As C1's charge depletes, eventually, the current will drop. The discharge of the capacitor 104 is complete when the current through the capacitor drops below a very low level, for example 1 µA. When this occurs, the VITSZ is off again.

The ON state transition of the VITSZ is triggered solely by the voltage across the VITSZ (when switch is OFF), and the OFF transition is triggered solely by the current through the VITSZ (when switch is ON). The VITSZ is self-contained or autonomous, needing no explicit control module at all, let alone any auxiliary power supply. This makes the implementation really simple and avoids the overhead of a control module.

The embodiments of FIG. 2 through FIG. 5 described herein employ BJT transistors. In other embodiments, other transistor types are used, for example an NMOSFET and a PMOSFET connected in the same fashion as shown in FIGS. 2 through 5. However, such configurations may not offer an ON state voltage drop as low as that given by embodiments that use BJT transistors, and may not provide an OFF state leakage as small as that given by embodiments that use BJT transistors.

Figure 2:
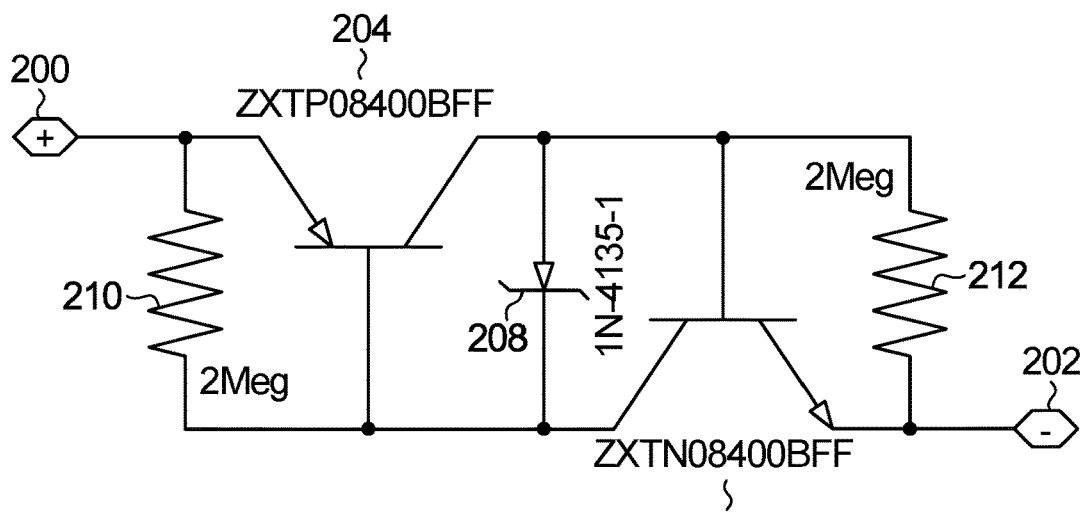
FIG. 2 depicts a schematic of a V&I triggered switch with turn-on voltage threshold set by Zener diode breakdown voltage (VITSZ).
Figure 3A:
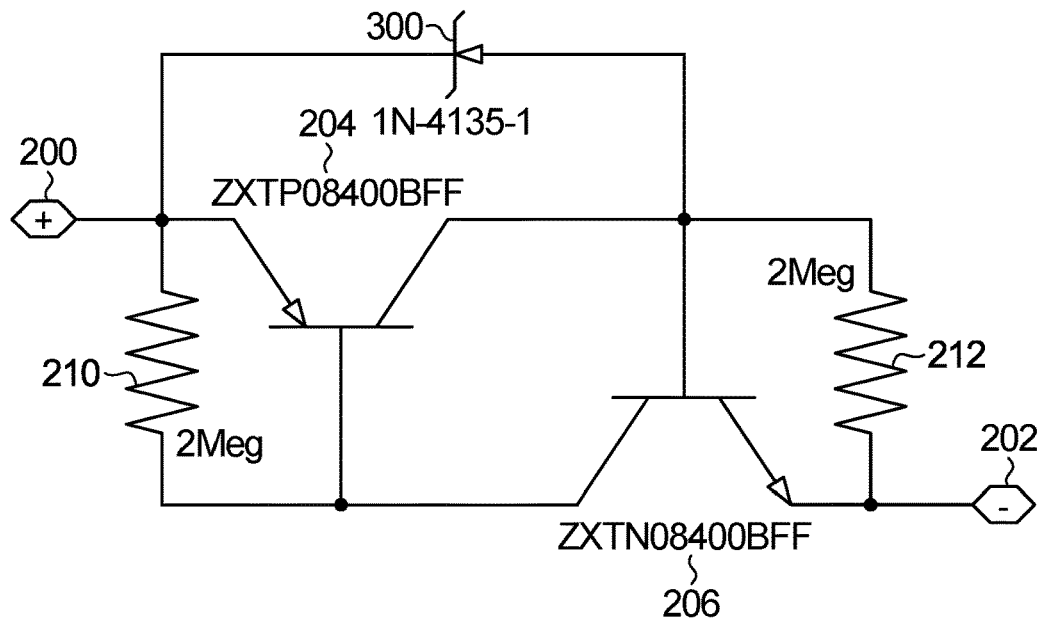
FIG. 3A depicts a schematic of another VITSZ.
Figure 3B:
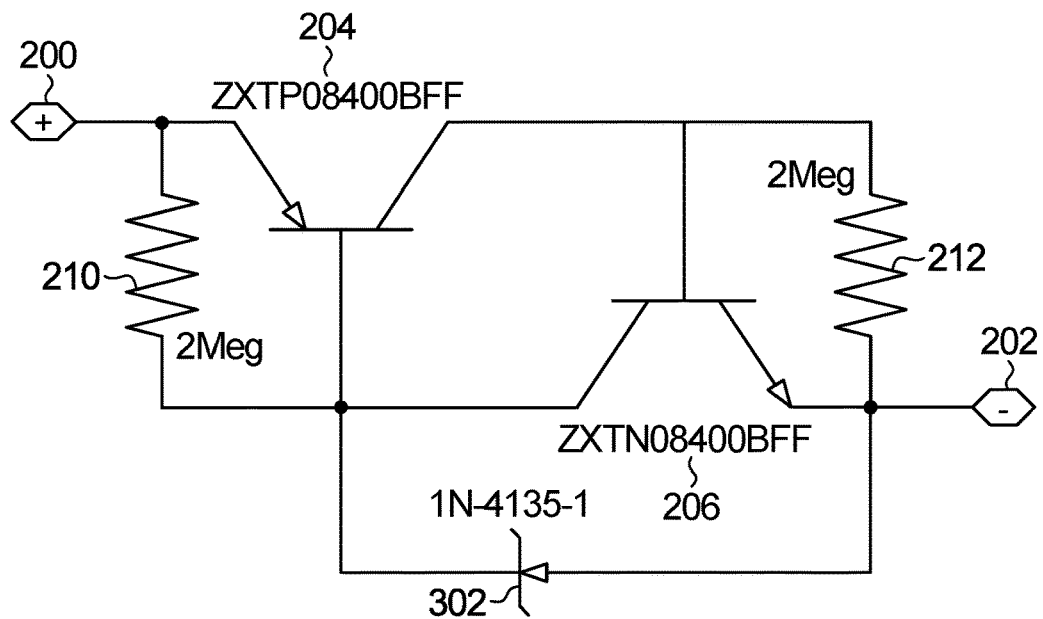
FIG. 3B depicts a schematic of yet another VITSZ.

Referring now to FIGS. 3A and 3B, shown are schematic diagrams of further VITSZs provided by an embodiment of the invention. The VITSZ of FIG. 3A differs from that of FIG. 2 in that there is a Zener diode 300 (instead of Zener diode 208) that triggers only transistor 206 which then also turns the other transistor 204 on. More specifically, the anode of the Zener diode 300 is connected to the collector of BJT 204, and the cathode of the Zener diode 208 is connected to the first terminal of the resistor 210. The VITSZ of FIG. 3B differs from that of FIG. 2 in that there is Zener diode 302 (instead of Zener diode 208) that triggers only transistor 204 which then also turns the other transistor 206 on. The anode of Zener diode 302 is connected to the emitter of BJT 206 and the cathode of Zener diode 302 is connected to the second terminal of resistor 210. The operation and performance of these variations is otherwise the same as that of FIG. 2.

It can be seen that the turn-on voltage for the embodiments of FIGS. 2 and 3A,3B is set by the breakdown voltage of the Zener diode 208 (or 300 and 302 for FIGS. 3A and 3B, respectively). This is in contrast to conventional SCR which do not include the Zener diode. In such conventional SCR, rather than turning on when the breakdown voltage of the Zener diode is reached, the voltage across the input terminals keeps increasing, and eventually, one of the two transistors will turn on. With the Zener diode, it is possible to precisely control when the transistors turn on. While specific circuits featuring a Zener diode to control the turn-on voltage are provided, it should be understood that other implementations are possible that use a Zener diode to an equivalent effect.

Advantageously, the provided VITSZ is self-contained or autonomous. Its state transitions are triggered solely and directly by its mission parameters, i.e., voltage across it (when switch is OFF) and current through it (when switch is ON). This means that there is no need for any control logic or driver for the switch, let alone the associated extra power needed—known as the overhead consumption.

In some embodiments, there is provided an additional mechanism to control the VITSZ, for example by a control module, in addition to the autonomous capability discussed above. For example, this may be provided so as to fine tune the energy harvesting efficiency.

Figure 4:
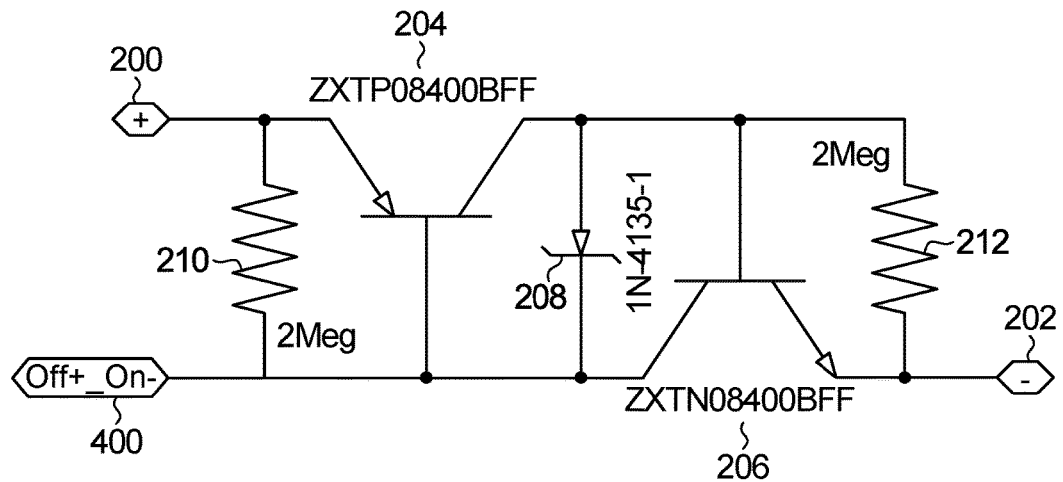
FIG. 4 depicts a schematic of a VITSZ with an additional control mechanism.

A schematic diagram for a first example VITSZ with an additional control mechanism is shown in FIG. 4. This VITSZ is the same as that of FIG. 2, but for the inclusion of a control terminal 400. Note that such a control terminal could also be added to the embodiments of FIGS. 3A and 3B. In the embodiment of FIG. 4, a positive pulse relative to the positive 200 applied to the control terminal 400 turns the VITSZ OFF, and a negative pulse applied to the same terminal 400 turns the VITSZ ON, all regardless of the present state of the switch.

Figure 5:
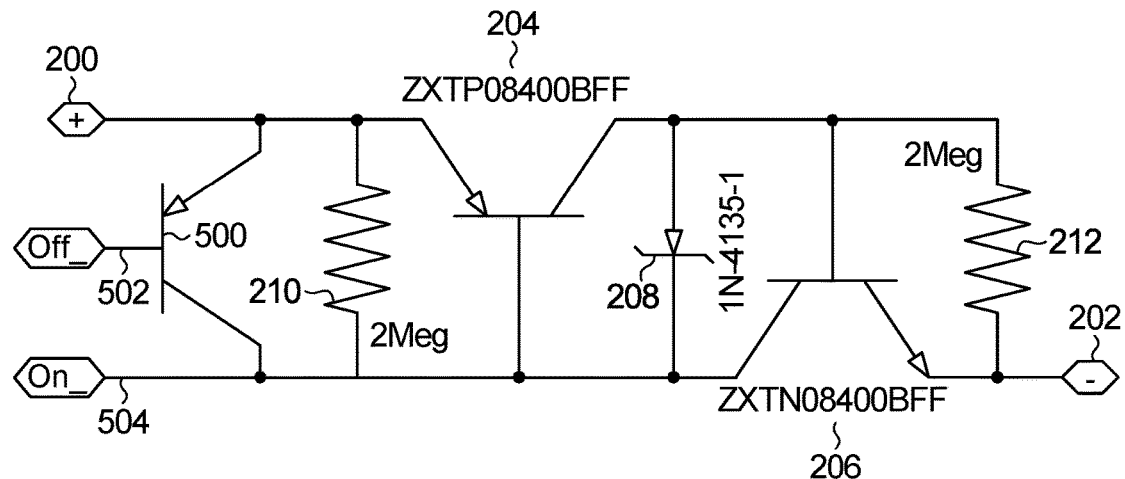
FIG. 5 depicts a schematic of another VITSZ with an additional control mechanism.

A schematic diagram for a second example VITSZ with an additional control mechanism is shown in FIG. 5. This VITSZ is the same as that of FIG. 2, but for the inclusion of additional control terminals 502,504 connected through PNP BJT 500. More specifically, OFF terminal 502 is connected to the base of BJT 500, and ON terminal 504 is connected to the collector of BJT 500. The emitter of BJT 500 is connected to the input terminal 200 (and one terminal of resistor 210), and the collector of BJT 500 is connected to the other terminal of resistor 210. The two input terminals 502,504 are active negative in the embodiment of FIG. 5. In the embodiment of FIG. 5, relative to input terminal 200, a negative pulse applied to terminal 502 turns the VITSZ OFF, and a negative pulse applied to terminal 504 turns the VITSZ ON—all regardless of the present state of the switch.

Figure 6:
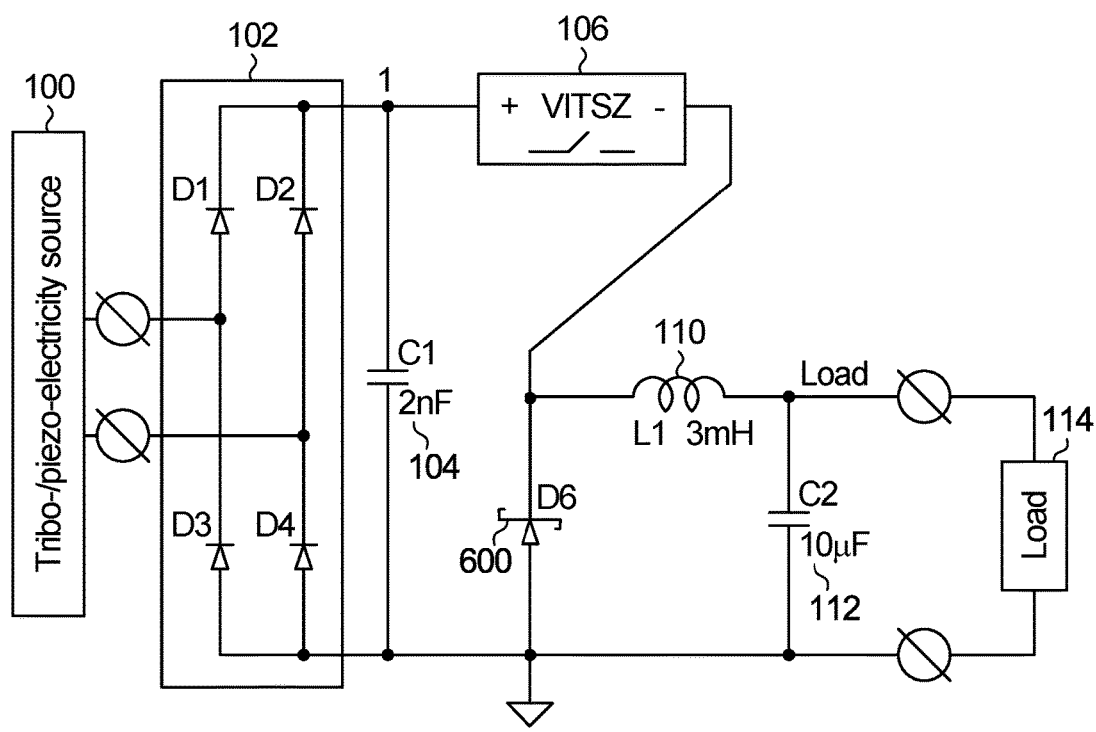
FIG. 6 depicts a schematic of an example implementation of a step-down DC-DC converter.

Referring now to FIG. 6, shown is a detailed schematic of a specific implementation of the step-down DC-DC converter of FIG. 1, provided by an embodiment of the invention. The same reference characters are used for convenience, but it should be understood that the implementation of FIG. 1 does not require the specific implementation of FIG. 6. In FIG. 6, the rectifier 102 is shown implemented using four diodes D1,D2,D3 and D4. An additional component shown in FIG. 6 that is not shown in FIG. 1 is Schottky diode D6 600, the purpose of which is detailed below. In FIG. 6, the Schottky diode D6 600 is connected between an output of the VITSZ 106 and ground. More specifically, the anode of the Schottky diode D6 600 is connected to ground, and the cathode of the Schottky diode D6 600 is connected to the output of VITSZ 106.

Specific component values, provided by way of example only, are shown in FIG. 6, and include:

C1=2 nF;
L1=3 mH;
C2=10 µF.

Figure 7:
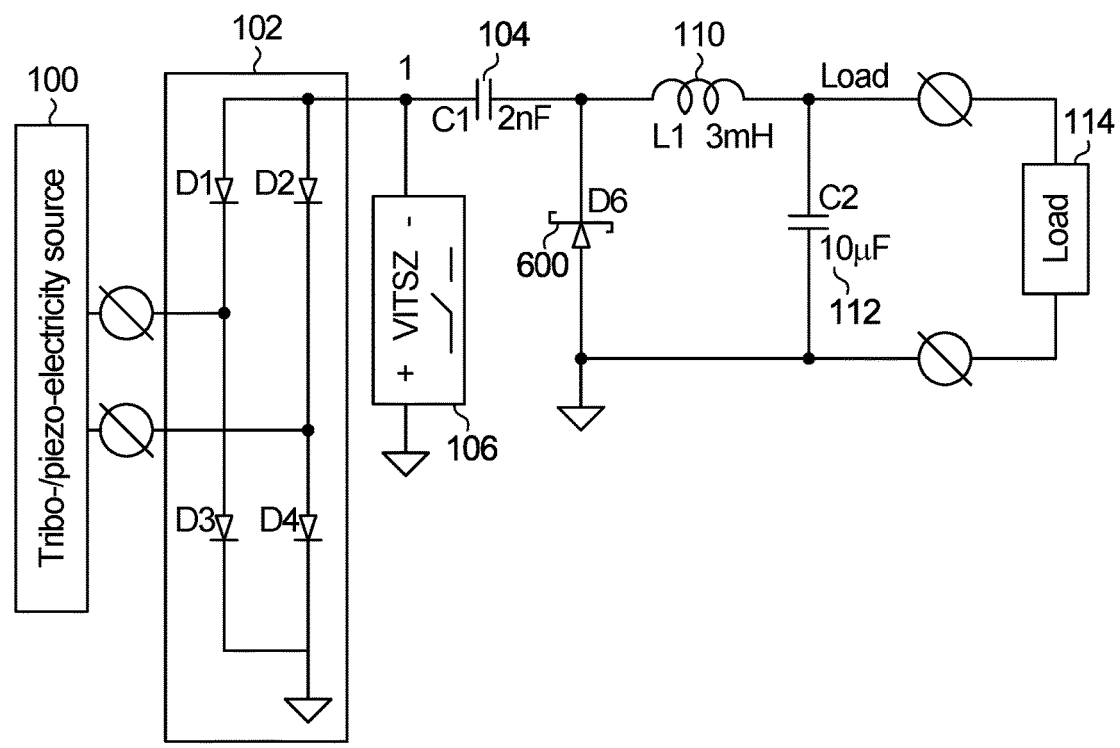
FIG. 7 depicts a schematic of another example implementation of a step-down DC-DC converter.

Referring now to FIG. 7, shown is a detailed schematic of another specific implementation of the step-down DC-DC converter of FIG. 1, provided by an embodiment of the invention. The circuit of FIG. 7 is very similar to that of FIG. 6, but a feature of the DC-DC converter of FIG. 7 is that one terminal of the VITSZ 106 is grounded. This feature can facilitate the design and implementation of a control module, if any.

Some embodiments features such a control module electrically connected to the VITSZ it controls. In some embodiments, the control module comprises a microcontroller and a driver for the VITSZ, and the electro-magnetic interference (EMI) to such a sophisticated module is minimized if its ground is connected to the common ground of the rest of the system, i.e., the triangles shown in FIG. 6 and FIG. 7. This condition is satisfied in FIG. 7 but not in FIG. 6; therefore, if the VITSZ does need a control module, then the schematic in FIG. 7 is recommended over that in FIG. 6. In FIG. 7, Schottky diode 600 is connected between a second terminal of the capacitor 104 and ground. The functionality of the two circuits of FIGS. 6 and 7 is basically the same. More specifically, the anode of the Schottky diode 600 is connected to ground, and the cathode of the Schottky diode 600 is connected to the second terminal of the capacitor 104.

For both embodiments of FIGS. 6 and 7, as before, note that the load 114 is not necessarily a resistor; it can be a resistor, a Zener diode, a battery, a super-capacitor, a combination of them, or any form of electronic load.

The voltage at Test Point 1 (marked "1") for the embodiment of FIG. 6 is positive while that for the embodiment of FIG. 7 is negative, but the load voltage is positive with both embodiments.

For both of the embodiments of FIGS. 6 and 7, the Schottky diode D6 600 provides a low loss fly-back path for the second energy transfer phase, which is activated whenever the VITSZ opens. Note that, if a regular diode is used in place of diode D6 600, there may be a benefit from a smaller reverse leakage current during the first energy transfer phase but the downside is a larger forward voltage drop during the second energy transfer phase. As a trade-off, a Schottky diode for D6 600 can be used because during the first energy transfer phase, the relatively larger leakage current of the Schottky diode, being in the order of 1 µA, is insignificant compared with the current being established in the inductor 110, of a few tens of mA; and during the second energy transfer phase, D6's forward voltage drop, of a fraction of a volt, is in series with the load voltage, of a few volts. Therefore, the loss incurred by the former is not insignificant, and a Schottky diode with a smaller forward voltage drop will be notably beneficial.

The reverse breakdown voltage of D6, when present, should be larger than the largest possible voltage on C1. An example is RFN2L4S, which does not breakdown until at least 400 V.

While the described embodiments all assume a single Zener diode is used to set the turn-on voltage, more generally, one or more Zener diodes connected in series can be used to set the turn-on voltage.

Figure 8:
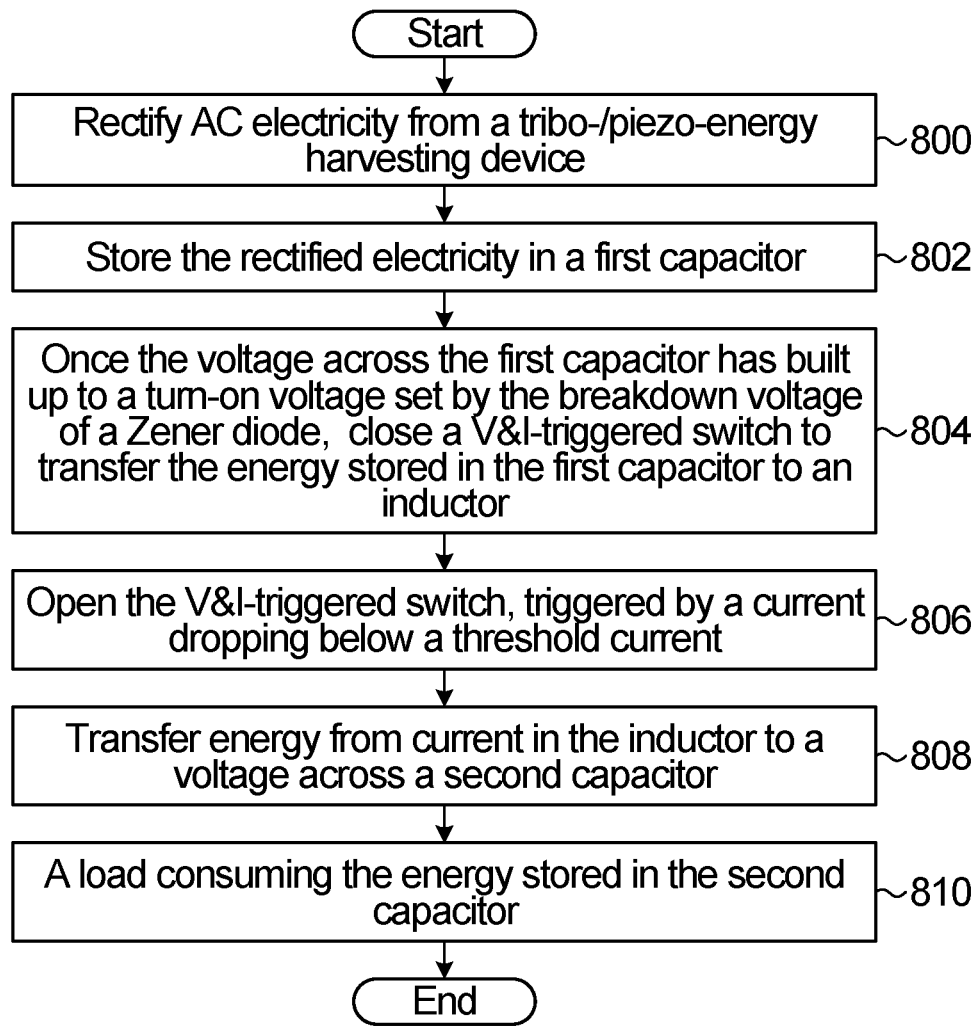
FIG. 8 is a flowchart of a method of DC-DC conversion provided by an embodiment of the invention.

Referring now to FIG. 8, shown is a flowchart of a method of DC-DC conversion provided by an embodiment of the invention. The method begins in block 800 with rectifying AC electricity from a tribo-/piezo-energy harvesting device. In block 802, the rectified electricity is stored in a first capacitor. The capacitance of the capacitor may be relatively small, at least relative to capacitance of the second capacitor introduced below, so that the voltage can build up quickly. In block 804, once the voltage across the first capacitor has built up to a turn-on voltage set by the breakdown voltage of a Zener diode, indicating that a certain amount of energy has been collected and is ready for conversion, a V&I triggered switch with turn-on voltage threshold set by Zener diode breakdown voltage (VITSZ) closes to transfer the energy stored in the first capacitor to an inductor. The step of turning the form of the energy from voltage across the first capacitor into the current in the inductor, is referred to herein as the first energy transfer phase. In block 806, once the first energy transfer phase has completed, indicated by the fact that there is little voltage across the first capacitor left, the V&I-triggered switch opens, triggered by a current dropping below a threshold current referred to as a holding current. This readies the first capacitor to accept harvested energy again. After the switch is opened in block 806, in block 808 a second energy transfer phase occurs in which the form of energy is turned from current in the inductor to a voltage across a second capacitor. The capacitance of the second capacitor is relatively large, in some embodiments much larger, compared to the capacitance of the first capacitor. The entire procedure is repeated when the voltage across the first capacitor reaches the threshold again. Optionally, in block 810, the energy stored in the second capacitor is consumed by a load.

Numerous modifications and variations of the present disclosure are possible in light of the above teachings. It is therefore to be understood that within the scope of the appended claims, the disclosure may be practiced otherwise than as specifically described herein.

The invention claimed is:

1. A voltage and current triggered switch that turns on when a voltage across the switch reaches a turn-on voltage and that turns off when a current through the switch drops below a holding current, the switch comprising:
   a Zener diode having a breakdown voltage, the Zener diode connected to set the turn-on voltage of the switch to be the breakdown voltage of the Zener diode;
   wherein the voltage and current switch is composed of discrete components that produce a leakage current in the voltage and current triggered switch while in an off state on the order of 20 nA.

2. The switch of claim 1 further comprising at least one control terminal for over-riding otherwise autonomous operation of the switch.

3. The switch of claim 2 wherein at least one control terminal comprises one terminal causing an ON and/or OFF transition in the switch.

4. The switch of claim 2 wherein at least one control terminal comprises a first terminal for causing an ON transition in the switch and a second terminal for causing an OFF transition in the switch.

5. The switch of claim 1 comprising:
   a positive terminal and a negative terminal;
   a PMOS transistor;
   an NMOS transistor;
   a first resistor;
   a second resistor;
   wherein the positive terminal is connected to a source of the PMOS transistor, and to a first terminal of the first resistor, and a second terminal of the first resistor is connected to a gate of the PMOS transistor;
   the negative terminal is connected to a source of the NMOS transistor and to a first terminal of a second resistor, and a second terminal of the second resistor is connected to a gate of the NMOS transistor;
   a drain of the PMOS transistor is connected to the gate of the NMOS transistor, and a drain of the NMOS transistor is connected to the gate of the PMOS transistor.

6. A voltage and current triggered switch that turns on when a voltage across the switch reaches a turn-on voltage and that turns off when a current through the switch drops below a holding current, the switch comprising:
   a Zener diode having a breakdown voltage, the Zener diode connected to set the turn-on voltage of the switch to be the breakdown voltage of the Zener diode;
   a positive terminal and a negative terminal;
   a PNP bipolar junction transistor (BJT);
   an NPN BJT;
   a first resistor;
   a second resistor;
   wherein the positive terminal is connected to an emitter of the PNP bipolar junction transistor, and to a first terminal of the first resistor, and a second terminal of the first resistor is connected to a base of the PNP BJT;
   the negative terminal is connected to an emitter of the NPN BJT and to a first terminal of a second resistor, and a second terminal of the second resistor is connected to a base of the NPN BJT;
   a collector of the PNP BJT is connected to the base of the NPN BJT, and a collector of the NPN BJT is connected to the base of the PNP BJT.

7. The switch of claim 6 wherein the Zener diode is connected between the collector of the PNP BJT and the base of the PNP BJT, and between the base of the NPN BJT and the collector of the NPN BJT.

8. The switch of claim 6 wherein the Zener diode is connected between the collector of the PNP BJT and the positive terminal.

9. The switch of claim 6 wherein the Zener diode is connected between the collector of the NPN BJT and the negative terminal.

10. An apparatus comprising:
a step-down DC-DC converter comprising a voltage and current triggered switch that turns on when a voltage across the switch reaches a turn-on voltage and that turns off when a current through the switch drops below a holding current, the switch comprising:
a Zener diode having a breakdown voltage, the Zener diode connected to set the turn-on voltage of the switch to be the breakdown voltage of the Zener diode;
wherein the voltage and current switch is composed of discrete components that produce a leakage current in the voltage and current triggered switch while in an off state on the order of 20 nA.

11. The apparatus of claim 10 wherein one terminal of the switch is connected to ground.

12. The apparatus of claim 10 comprising:
a rectifier for rectifying a voltage received at an input to the step-down DC-DC converter;
a first capacitor connected to be charged by the rectified voltage while the switch is open;
an inductor connected to receive a discharge current from the first capacitor while the switch is closed;
a second capacitor connected to be charged by current from the inductor while the switch is again open.

13. The apparatus of claim 12 wherein the switch is connected between a terminal of the first capacitor and a terminal of the inductor.

14. The apparatus of claim 13 further comprising:
a Schottky diode connected between an output of the switch and ground to provide a low loss fly-back path during charging of the second capacitor.

15. The apparatus of claim 12 wherein a terminal of the switch is connected between a terminal of the rectifier and a first terminal of the first capacitor.

16. The apparatus of claim 15 further comprising:
a Schottky diode connected between a second terminal of the first capacitor and ground to provide a low loss fly-back path during charging of the second capacitor.

17. The apparatus of claim 12 further comprising:
a tribo-electricity source;
wherein the stepdown DC-DC converter is connected to receive an output of the tribo-electricity source;
a load connected to an output of the stepdown DC-DC converter.

18. The apparatus of claim 12 further comprising:
a piezo-electricity source;
wherein the stepdown DC-DC converter is connected to receive an output of the piezo-electricity source;
a load connected to an output of the stepdown DC-DC converter.

19. A method comprising:
rectifying AC electricity from a tribo energy harvesting device or a piezo energy harvesting device;
storing the rectified electricity in a first capacitor;
once the voltage across the first capacitor has built up to a turn-on voltage set by the breakdown voltage of a Zener diode, closing a V&I triggered switch with turn-on voltage threshold set by Zener diode breakdown voltage (VITSZ) to transfer the energy stored in the first capacitor to an inductor;
opening the VITSZ, triggered by a current dropping below a threshold current;
transferring energy from current in the inductor to a voltage across a second capacitor; and
a load consuming the energy stored in the second capacitor.

20. The method of claim 19 further comprising:
using at least one control terminal for over-riding otherwise autonomous operation of the method.

21. The method of claim 20 wherein using at least one control terminal comprises using one terminal causing an ON and/or OFF transition in the switch.

22. The method of claim 20 wherein using at least one control terminal comprises using a first terminal for causing an ON transition in the VITSZ and a second terminal for causing an OFF transition in the VITSZ.

* * * * *